United States Patent
Nomizu et al.

(10) Patent No.: US 11,161,979 B2
(45) Date of Patent: Nov. 2, 2021

(54) RESIN COMPOSITION, PREPREG, METALLIC FOIL-CLAD LAMINATE, AND PRINTED WIRING BOARD

(71) Applicant: MITSUBISHI GAS CHEMICAL COMPANY, INC., Tokyo (JP)

(72) Inventors: Kentaro Nomizu, Yamagata (JP); Mitsuru Ohta, Fukushima (JP); Masanobu Sogame, Tokyo (JP); Yoshinori Mabuchi, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 635 days.

(21) Appl. No.: 15/322,929

(22) PCT Filed: Jul. 14, 2015

(86) PCT No.: PCT/JP2015/070147
§ 371 (c)(1),
(2) Date: Dec. 29, 2016

(87) PCT Pub. No.: WO2016/010033
PCT Pub. Date: Jan. 21, 2016

(65) Prior Publication Data
US 2017/0145213 A1  May 25, 2017

(30) Foreign Application Priority Data

Jul. 18, 2014 (JP) .............................. JP2014-147700

(51) Int. Cl.

| | |
|---|---|
| *C08L 79/04* | (2006.01) |
| *C08J 5/24* | (2006.01) |
| *C08K 5/3415* | (2006.01) |
| *C08K 9/02* | (2006.01) |
| *B32B 15/08* | (2006.01) |
| *C08K 3/34* | (2006.01) |
| *B32B 27/20* | (2006.01) |
| *C08L 101/00* | (2006.01) |
| *H05K 1/03* | (2006.01) |

(52) U.S. Cl.
CPC .............. *C08L 79/04* (2013.01); *B32B 15/08* (2013.01); *B32B 27/20* (2013.01); *C08J 5/24* (2013.01); *C08K 3/34* (2013.01); *C08K 5/3415* (2013.01); *C08K 9/02* (2013.01); *C08L 101/00* (2013.01); *H05K 1/0373* (2013.01); *C08J 2379/04* (2013.01); *C08J 2463/04* (2013.01); *C08J 2479/08* (2013.01); *C08L 2203/20* (2013.01); *C08L 2205/025* (2013.01); *C08L 2205/035* (2013.01); *H05K 2201/0154* (2013.01); *H05K 2201/0209* (2013.01); *H05K 2201/0257* (2013.01); *H05K 2201/0266* (2013.01); *H05K 2201/06* (2013.01)

(58) Field of Classification Search
None
See application file for complete search history.

(56) References Cited

U.S. PATENT DOCUMENTS

| | | | |
|---|---|---|---|
| 5,962,550 A | 10/1999 | Akahane et al. | |
| 2001/0018169 A1* | 8/2001 | Sampei ................ | G03C 1/4989 430/350 |
| 2002/0058739 A1* | 5/2002 | Lorah ....................... | C08F 2/00 524/445 |
| 2003/0134212 A1* | 7/2003 | Castle ...................... | B41M 5/42 430/63 |
| 2008/0064792 A1* | 3/2008 | Hwang ................... | C08L 63/00 523/466 |
| 2008/0176984 A1 | 7/2008 | Hwang et al. | |
| 2009/0075081 A1 | 3/2009 | Ouvrard et al. | |
| 2010/0092764 A1 | 4/2010 | Chung et al. | |
| 2014/0079953 A1* | 3/2014 | Esseghir .............. | C08G 59/027 428/413 |
| 2015/0105506 A1 | 4/2015 | Benighaus et al. | |
| 2016/0007453 A1 | 1/2016 | Kawate | |

FOREIGN PATENT DOCUMENTS

| | | |
|---|---|---|
| CN | 101054460 A | 10/2007 |
| EP | 0460548 A2 | 12/1991 |
| JP | 10-265318 | 10/1998 |
| JP | 2001-348488 | 12/2001 |
| JP | 2006-8843 | 1/2006 |
| JP | 2008-519879 | 6/2008 |
| JP | 2014-167053 | 9/2014 |
| JP | 2015-078368 | 4/2015 |

OTHER PUBLICATIONS

ChemicalAid—(Al2O3)3(SiO2)2—Mullite Molar Mass. Retrieved on Dec. 26, 2018 http://www.chemicalaid.com/tools/molarmass.php?formula=(Al2O3)3(SiO2)2 (Year: 2018).*
International Search Report issued in Patent Application No. PCT/JP2015/070147, dated Sep. 8, 2015, along with an English translation thereof.

* cited by examiner

*Primary Examiner* — Megan McCulley
(74) *Attorney, Agent, or Firm* — Greenblum & Bernstein, P.L.C.

(57) ABSTRACT

A resin composition including an inorganic filler (B) having an aluminosilicate (A) having a silicon atom content of from 9 to 23% by mass, an aluminum atom content of from 21 to 43% by mass, and an average particle diameter (D50) of from 0.5 to 10 μm; and any one or more thermosetting compounds selected from the group consisting of an epoxy resin (C), a cyanate compound (D), a maleimide compound (E), a phenolic resin (F), an acrylic resin (G), a polyamide resin (H), a polyamideimide resin (I), and a thermosetting polyimide resin (J), wherein a content of the inorganic filler (B) is from 250 to 800 parts by mass based on 100 parts by mass of resin solid content.

11 Claims, No Drawings

RESIN COMPOSITION, PREPREG, METALLIC FOIL-CLAD LAMINATE, AND PRINTED WIRING BOARD

TECHNICAL FIELD

The present invention relates to a resin composition, a prepreg, a metallic foil-clad laminate, and a printed wiring board.

BACKGROUND ART

In recent years, higher integration, higher functionality, and higher density mounting of semiconductors widely used in electronic equipment, communication instruments, personal computers, and the like have accelerated increasingly, and the demand for the characteristics of printed wiring boards has increased more than ever before. Particularly, heat dissipation techniques for printed wiring boards against heat generation have been required. This is because with higher functionality of semiconductors, the amount of heat generated from the semiconductors has increased, and due to the influence of higher integration and higher density mounting, configurations in which heat is likely to accumulate inside have been provided.

Thermosetting resins such as epoxy resins used for the insulating layers of printed wiring boards have low thermal conductivity in themselves. Therefore, a method of highly filling a thermosetting resin with an inorganic filler having excellent thermal conductivity in order to improve thermal conductivity as a printed wiring board is known (Patent Literature 1).

CITATION LIST

Patent Literature

Patent Literature 1: Japanese Patent Laid-Open No. 2001-348488

SUMMARY OF INVENTION

Technical Problem

But, when a content of an inorganic filler in a thermosetting resin composition increases, the volume ratio of the thermosetting resin decreases, and thus the moldability deteriorates, and cracks and voids are likely to occur between the resin and the inorganic filler. In addition, as inorganic fillers having excellent thermal conductivity, alumina and boehmite are known, but alumina is hard, and therefore a printed wiring board in which a resin composition containing alumina is used has a drawback in that it has poor processability, and has a problem in that, particularly in hole processing by a mechanical drill, the wear and breakage of the drill bit are significant. On the other hand, boehmite has lower Mohs hardness than alumina, and therefore boehmite provides excellent processability in a printed wiring board in which a resin composition containing boehmite is used, but a problem of boehmite is that it deteriorates the dielectric loss tangent.

The present invention has been made in view of the above problems, and it is an object of the present invention to provide a resin composition that provides a cured product having excellent heat dissipation characteristics, mechanical drillability, and dielectric characteristics and having high glass transition temperature while maintaining excellent moldability, and a prepreg, a metallic foil-clad laminate, and a printed wiring board using the same.

Solution to Problem

The present inventors have found that a resin composition containing predetermined amounts of an inorganic filler (B) containing a predetermined aluminosilicate (A) and a thermosetting compound can achieve the above object, leading to the completion of the present invention.

Specifically, the present invention is as follows.

[1]

A resin composition comprising:

an inorganic filler (B) containing an aluminosilicate (A) having a silicon atom content of from 9 to 23% by mass, an aluminum atom content of from 21 to 43% by mass, and an average particle diameter (D50) of from 0.5 to 10 μm; and one or more thermosetting compounds selected from the group consisting of an epoxy resin (C), a cyanate compound (D), a maleimide compound (E), a phenolic resin (F), an acrylic resin (G), a polyamide resin (H), a polyamideimide resin (I), and a thermosetting polyimide resin (J), wherein a content of the inorganic filler (B) is from 250 to 800 parts by mass based on 100 parts by mass of resin solid content.

[2]

The resin composition according to [1], wherein the inorganic filler (B) contains a second inorganic filler (K) having an average particle diameter (D50) of from 0.1 to 0.4 μm.

[3]

The resin composition according to [2], wherein the second inorganic filler (K) is one or more selected from the group consisting of an aluminosilicate having a silicon atom content of from 9 to 23% by mass and an aluminum atom content of from 21 to 43% by mass, alumina, magnesium oxide, boron nitride, and aluminum nitride.

[4]

The resin composition according to any one of [1] to [3], wherein the cyanate compound (D) is one or more selected from the group consisting of a naphthol aralkyl-based cyanate compound represented by general formula (1), a novolac-based cyanate compound represented by general formula (2), and a biphenyl aralkyl-based cyanate compound represented by general formula (3),

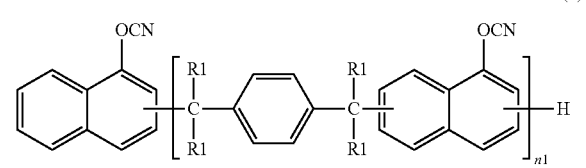

wherein R1 each independently represents a hydrogen atom or a methyl group, and n1 represents an integer of from 1 to 50,

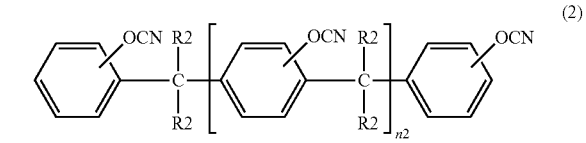

wherein R2 each independently represents a hydrogen atom or a methyl group, and n2 represents an integer of from 1 to 50 or more,

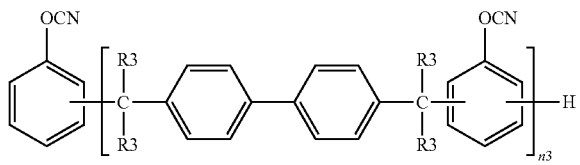

(3)

wherein R3 each independently represents a hydrogen atom or a methyl group, and n3 represents an integer of from 1 to 50.

[5]

The resin composition according to any one of [1] to [4], wherein the maleimide compound (E) is one or more selected from the group consisting of bis(4-maleimidophenyl)methane, 2,2-bis{4-(4-maleimidophenoxy)-phenyl}propane, and bis(3-ethyl-5-methyl-4-maleimidophenyl)methane.

[6]

The resin composition according to any one of [1] to [5], further comprising a molybdenum compound (L).

[7]

The resin composition according to [6], wherein a content of the molybdenum compound (L) is from 0.1 to 10 parts by mass based on 100 parts by mass of the resin solid content.

[8]

The resin composition according to [6] or [7], wherein a surface of the molybdenum compound (L) is treated with an inorganic oxide.

[9]

A prepreg comprising:

a base material; and the resin composition according to any one of [1] to [8] with which the base material is impregnated or coated.

[10]

A metallic foil-clad laminate comprising:

the prepreg according to [9]; and a metallic foil laminated on one or both surfaces of the prepreg.

[11]

A printed wiring board comprising:

an insulating layer comprising the resin composition according to any one of [1] to [8]; and a conductor layer formed on a surface of the insulating layer.

Advantageous Effect of Invention

According to the present invention, it is possible to provide a resin composition that provides a cured product having excellent heat dissipation characteristics, mechanical drillability, and dielectric characteristics and having high glass transition temperature while maintaining excellent moldability. Particularly, a prepreg, a metallic foil-clad laminate, and a printed wiring board obtained using the resin composition not only have high glass transition temperature and high thermal conductivity but also have good electrical characteristics and mechanical drillability and therefore are preferred for printed wiring board materials adapted to higher integration and higher density and have extremely high industrial practicality.

DESCRIPTION OF EMBODIMENT

A mode for carrying out the present invention (hereinafter referred to as "the present embodiment") will be described in detail below, but the present invention is not limited to this, and various modifications can be made without departing from the gist thereof.

[Resin Composition]

A resin composition in the present embodiment comprises an inorganic filler (B) containing an aluminosilicate (A) having a silicon atom content of from 9 to 23% by mass, an aluminum atom content of from 21 to 43% by mass, and an average particle diameter (D50) of from 0.5 to 10 μm; and one or more thermosetting compounds selected from the group consisting of an epoxy resin (C), a cyanate compound (D), a maleimide compound (E), a phenolic resin (F), an acrylic resin (G), a polyamide resin (H), a polyamideimide resin (I), and a thermosetting polyimide resin (J), and the content of the above inorganic filler (B) is from 250 to 800 parts by mass based on 100 parts by mass of resin solid content.

[Inorganic Filler (B)]

The inorganic filler (B) contains the aluminosilicate (A) and can contain other components as needed. The inorganic filler (B) preferably contains a second inorganic filler (K) having an average particle diameter (D50) of from 0.1 to 0.4 μm as the other component.

(Aluminosilicate (A))

An aluminosilicate is generally represented by the composition formula: $mAl_2O_3 \cdot nSiO_2$ and is an inorganic filler in which some silicon atoms present in silica ($SiO_2$) are replaced by aluminum atoms. In the present embodiment, the aluminosilicate (A) having a silicon atom content of from 9 to 23% by mass, an aluminum atom content of from 21 to 43% by mass, and an average particle diameter (D50) of from 0.5 to 10 μm is used.

The silicon atom content is from 9 to 23% by mass, preferably from 14 to 23% by mass, and more preferably from 16 to 21% by mass based on 100% by mass of the aluminosilicate (A). When the silicon atom content is in the above range, the mechanical drillability of the obtained cured product improves more.

The silica ($SiO_2$) content in the aluminosilicate (A) is preferably from 20 to 49% by mass, more preferably from 30 to 49% by mass, and further preferably from 35 to 45% by mass. When the silica content is in the above range, the mechanical drillability of the obtained cured product tends to improve more.

The aluminum atom content is from 21 to 43% by mass, preferably from 23 to 40% by mass, and more preferably from 26 to 38% by mass based on 100% by mass of the aluminosilicate (A). When the aluminum atom content is in the above range, the thermal conductivity and electrical characteristics of the obtained cured product improve more.

The alumina ($Al_2O_3$) content in the aluminosilicate (A) is preferably from 41 to 80% by mass, more preferably from 45 to 75% by mass, and further preferably from 50 to 70% by mass. When the alumina content is in the above range, the thermal conductivity and electrical characteristics of the obtained cured product tend to improve more.

In addition, the total of the alumina content and the silica content is preferably a content of from 90 to 100% by mass.

The silicon atom content and the aluminum atom content can be measured by a method described in Examples.

The aluminosilicate (A) may comprise other atoms other than silicon atoms, aluminum atoms, and oxygen atoms. The other atoms are not particularly limited. Examples thereof include titanium and iron. The other atoms may be contained in the aluminosilicate (A) in the form of titanium oxide ($TiO_2$), iron(III) oxide ($Fe_2O_3$), or the like. When the aluminosilicate (A) comprises other atoms, the total content of silicon atoms, aluminum atoms, and oxygen atoms is preferably from 90 to 100% by mass, more preferably from 95 to 100% by mass, and further preferably 100% by mass based on 100% by mass of the aluminosilicate (A). When the total content of silicon atoms, aluminum atoms, and oxygen atoms is in the above range, the mechanical drillability, thermal conductivity, and electrical characteristics of the obtained cured product tend to improve more.

The average particle diameter (D50) of the aluminosilicate (A) is from 0.5 to 10 μm, preferably from 2 to 8 μm, and more preferably from 3 to 7 μm. When the average particle diameter (D50) is in the above range, the insulation reliability, perforability, and thermal conductivity of the obtained cured product improve more. The average particle diameter (D50) means a median diameter and is a diameter at which the amount of particles having a larger diameter and the amount of particles having a smaller diameter become equivalent when measuring the particle size distribution of a powder. The average particle diameter (D50) can be generally measured by a wet laser diffraction-scattering method.

The shape of the aluminosilicate (A) is not particularly limited but is preferably a shape closer to a spherical shape. When the shape of the aluminosilicate (A) is close to a spherical shape, the specific surface area tends to decrease, and the fluidity of the resin composition tends to improve. Therefore, molding defects such as voids during molding tend to be able to be reduced even when the composition contains the inorganic filler in a high content.

The content of the aluminosilicate (A) is preferably 200 to 600 parts by mass, more preferably from 250 to 500 parts by mass, and further preferably from 300 to 450 parts by mass based on 100 parts by mass of the resin solid content. When the content of the aluminosilicate (A) is in the above range, the thermal conductivity and moldability of the obtained cured product tend to improve more.

In addition, the content of the aluminosilicate (A) is preferably from 60 to 100% by mass, more preferably from 70 to 100% by mass, and further preferably 100% by mass based on 100% by mass of the inorganic filler (B). When the content of the aluminosilicate (A) is in the above range, the thermal conductivity and mechanical drillability of the obtained cured product tend to improve more.

(Other Components)

Components other than the aluminosilicate (A) used for the inorganic filler (B) in the present embodiment are not particularly limited as long as they are ones which are used in an insulating resin for a printed wiring board. Examples thereof include silicas such as natural silica, fused silica, amorphous silica, and hollow silica; oxides such as aluminosilicates other than the aluminosilicate (A), alumina, and magnesium oxide; metal hydrates such as aluminum hydroxide, boehmite, magnesium hydroxide, and heat-treated products of aluminum hydroxide (products obtained by heat-treating aluminum hydroxide to decrease some of the water of crystallization); nitrides such as boron nitride, aggregated boron nitride, silicon nitride, and aluminum nitride; zinc borate, zinc stannate, clay, kaolin, talc, calcined clay, calcined kaolin, calcined talc, mica, glass short fibers (fine powders of glass such as E glass and D glass), and hollow glass. One of these may be used, or two or more of these may be used in appropriate combination.

The average particle diameter (D50) of another component other than the aluminosilicate (A) is preferably from 0.1 to 10 μm, more preferably from 0.1 to 0.4 μm. When the average particle diameter (D50) is in the above range, the dispersibility tends to improve more. In addition, the shape of another component is not particularly limited but is preferably a shape closer to a spherical shape. When the shape is close to a spherical shape, the specific surface area tends to decrease.

(Second Inorganic Filler (K))

Among the other components other than the aluminosilicate (A) of the inorganic filler (B) described above, the second inorganic filler (K) having an average particle diameter (D50) of from 0.1 to 0.4 μm is preferably used. The second inorganic filler (K) is not particularly limited. Examples thereof include one or more selected from the group consisting of an aluminosilicate having a silicon atom content of from 9 to 23% by mass and an aluminum atom content of from 21 to 43% by mass, alumina, magnesium oxide, boron nitride, and aluminum nitride. By using such a second inorganic filler (K), the thermal conductivity of the obtained cured product tends to improve more.

The average particle diameter (D50) of the second inorganic filler (K) is preferably from 0.1 to 0.4 μm, more preferably from 0.2 to 0.4 μm. When the average particle diameter (D50) is in the above range, the second inorganic filler (K) can enter into the gaps between the particles of the aluminosilicate (A) and the like having a relatively large average particle diameter. Thus, the volume content of the inorganic filler in the resin composition can be increased, and further the thermal conductivity tends to improve more. In addition, the shape of the second inorganic filler (K) is not particularly limited but is preferably a shape closer to a spherical shape. When the shape is close to a spherical shape, the fluidity of the resin composition improves, and therefore molding defects such as voids during molding tend to be able to be reduced even when the resin composition comprises the inorganic filler (B) in a high content.

The content of the second inorganic filler (K) is preferably 50 to 200 parts by mass, more preferably from 75 to 150 parts by mass, and further preferably from 100 to 125 parts by mass based on 100 parts by mass of the resin solid content. When the content of the second inorganic filler (K) is in the above range, the thermal conductivity and moldability of the obtained cured product tend to improve more.

The ratio between the mass of the aluminosilicate (A) and the mass of the second inorganic filler (K) is preferably 1:0.03 to 1:0.5, more preferably from 1:0.1 to 1:0.45, and further preferably from 1:0.2 to 1:0.4. The particles of the second inorganic filler (K) having a relatively small average particle diameter (D50) can enter into the gaps between the particles of other inorganic fillers having a large average particle diameter (D50). Therefore, when the mass ratio is in the above range, the filling density of the inorganic filler in the resin composition tends to be able to be more improved. As a result, the fluidity as the resin composition improves, and molding defects such as voids during press molding tend to be able to be reduced.

The content of the inorganic filler (B) is from 250 to 800 parts by mass, preferably from 300 to 700 parts by mass, and more preferably from 400 to 500 parts by mass based on 100 parts by mass of the resin solid content. When the content of the inorganic filler (B) is in the above range, the thermal conductivity and the moldability improve more. The "resin solid content" refers to components in the resin composition other than a solvent and the inorganic filler (B) unless otherwise noted, and "100 parts by mass of the resin solid content" means that the total of the components in the resin composition other than the solvent and the inorganic filler is 100 parts by mass.

In addition, the volume of the inorganic filler (B) is preferably from 40 to 70% by volume, more preferably from 50 to 70% by volume, based on 100% by volume of the total volume of the resin composition. When the volume proportion of the inorganic filler (B) is in the above range, the thermal conductivity of the obtained cured product tends to improve more.

[Thermosetting Compound]

The thermosetting compound comprises any one or more selected from the group consisting of epoxy resin (C), cyanate compound (D), maleimide compound (E), phenolic resin (F), acrylic resin (G), polyamide resin (H), polyamideimide resin (I), and thermosetting polyimide resin (J).

Among these, one or more selected from the group consisting of the epoxy resin (C), the cyanate compound (D), and the maleimide compound (E) are preferred as the thermosetting compound. By using the epoxy resin (C), characteristics, such as heat resistance, thermal conductivity, and water absorption rate, of the obtained cured product tend to improve more. By using the cyanate compound (D), the solubility in a solvent tends to be good, the heat resistance and chemical resistance of the obtained cured product tend to improve more, and the curability of the resin composition tends to improve more. By using the maleimide compound (E), the heat resistance and chemical resistance of the obtained cured product tend to improve more, and the curability and the like of the resin composition tend to improve more. Further, by using the epoxy resin (C), the cyanate compound (D), and the maleimide compound (E) in combination, the flame retardancy, heat resistance, chemical resistance, thermal conductivity, water absorption rate, curability, and elastic modulus of the obtained cured product tend to improve more. One thermosetting compound may be used, or two or more thermosetting compounds may be used in appropriate combination. The compounds will be described below.

(Epoxy Resin (C))

The epoxy resin (C) is not particularly limited as long as it is a compound having two or more epoxy groups in one molecule. Known ones can be used. Example thereof include biphenyl aralkyl-based epoxy resins, polyoxynaphthylene-based epoxy resins, triphenolmethane-based epoxy resins, bisphenol A-based epoxy resins, bisphenol F-based epoxy resins, phenol novolac-based epoxy resins, cresol novolac-based epoxy resins, bisphenol A novolac-based epoxy resins, brominated bisphenol A-based epoxy resins, brominated phenol novolac-based epoxy resins, trifunctional phenol-based epoxy resins, tetrafunctional phenol-based epoxy resins, naphthalene-based epoxy resins, biphenyl-based epoxy resins, phenol aralkyl-based epoxy resins, naphthol aralkyl-based epoxy resins, alicyclic epoxy resins, polyol-based epoxy resins, phosphorus-containing epoxy resins, glycidyl amines, glycidyl esters, compounds obtained by epoxidizing a double bond of butadiene or the like, and compounds obtained by the reaction of hydroxyl group-containing silicone resins with epichlorohydrin.

Among these, biphenyl aralkyl-based epoxy resins, polyoxynaphthylene-based epoxy resins, triphenolmethane-based epoxy resins, bisphenol A-based epoxy resins, bisphenol F-based epoxy resins, phenol novolac-based epoxy resins, cresol novolac-based epoxy resins, bisphenol A novolac-based epoxy resins, brominated bisphenol A-based epoxy resins, brominated phenol novolac-based epoxy resins, biphenyl-based epoxy resins, phenol aralkyl-based epoxy resins, and naphthol aralkyl-based epoxy resins are preferred. By using these epoxy resins (C), characteristics such as water absorbency and moisture absorption heat resistance tend to improve more while the heat resistance of the obtained cured product is maintained. One of these epoxy resins (C) may be used, or two or more of these epoxy resins (C) may be used in appropriate combination.

The content of the epoxy resin (C) is preferably from 10 to 90 parts by mass, more preferably from 30 to 70 parts by mass, and further preferably from 30 to 50 parts by mass based on 100 parts by mass of the resin solid content. When the content of the epoxy resin (C) is in the above range, the heat resistance, thermal conductivity, and water absorbency of the obtained cured product tend to improve more.

(Cyanate Compound (D))

The cyanate compound (D) is not particularly limited, and generally known cyanate compounds can be used. Examples thereof include a naphthol aralkyl-based cyanate compound represented by the following general formula (1), a novolac-based cyanate compound represented by the following general formula (2), a biphenyl aralkyl-based cyanate compound represented by the following general formula (3), 1,3-dicyanatobenzene, 1,4-dicyanatobenzene, 1,3,5-tricyanatobenzene, bis(3,5-dimethyl 4-cyanatophenyl)methane, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl)methane, bis(4-cyanatophenyl)propane, bis(4-cyanatophenyl) ether, bis(4-cyanatophenyl) thioether, bis(4-cyanatophenyl) sulfone, 2,2'-bis(4-cyanatophenyl)propane, and bis(3,5-dimethyl, 4-cyanatophenyl)methane.

Among these, one or more selected from the group consisting of the naphthol aralkyl-based cyanate compound represented by the following general formula (1), the novolac-based cyanate compound represented by the following general formula (2), and the biphenyl aralkyl-based cyanate compound represented by the following general formula (3) are preferred. By using such a cyanate compound (D), the flame retardancy of the obtained cured product tends to improve more, the curability of the resin composition tends to improve more, and the thermal expansion coefficient of the cured product tends to decrease more.

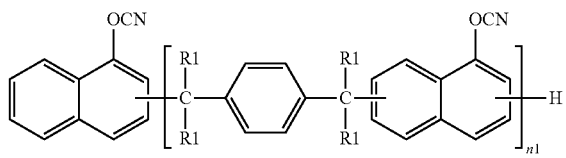

(1)

wherein R1 each independently represents a hydrogen atom or a methyl group, and n1 represents an integer of from 1 to 50.

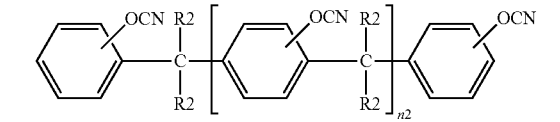

(2)

wherein R2 each independently represents a hydrogen atom or a methyl group, and n2 represents an integer of from 1 to 50.

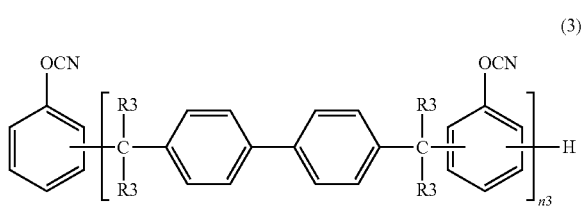

(3)

wherein R3 each independently represents a hydrogen atom or a methyl group, and n3 represents an integer of from 1 to 50.

In the above general formula (1), the substituents R1 each independently represent a hydrogen atom or a methyl group. Among these, an α-naphthol aralkyl-based cyanate compound in which the substituents R1 are hydrogen is preferred. By using such a cyanate compound (D), the water absorbency, the moisture absorption heat resistance, and the like tend to improve more while the heat resistance of the obtained cured product is maintained. In addition, in the above general formula (1), n1 to n3 each represent an integer of from 1 to 50, and one or two or more of a plurality of the cyanate compounds (D) in which n is different may be appropriately mixed and used.

The content of the cyanate compound (D) is preferably from 10 to 90 parts by mass, more preferably from 15 to 70 parts by mass, further preferably from 20 to 50 parts by mass, and particularly preferably from 20 to 40 parts by mass based on 100 parts by mass of the resin solid content. When the content of the cyanate compound (D) is in the above range, the heat resistance of the obtained cured product and the solvent solubility and curability of the resin composition tend to improve more.

(Maleimide Compound (E))

The maleimide compound (E) is not particularly limited as long as it is a compound having one or more maleimide groups in one molecule. Examples thereof include bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, and tris(4-maleimidophenyl)methane. These maleimide compounds may be used alone, or two or more of these maleimide compounds may be used in appropriate combination. In addition, the maleimide compound (E) may be not only in the form of a monomer but in the form of a prepolymer and may be in the form of a prepolymer of a bismaleimide compound and an amine compound. Among these, one or more selected from the group consisting of bis(4-maleimidophenyl)methane, 2,2-bis{4-(4-maleimidophenoxy)-phenyl}propane, and bis(3-ethyl-5-methyl-4-maleimidophenyl)methane can be preferably used from the viewpoint of heat resistance.

The content of the maleimide compound (E) is preferably from 10 to 90 parts by mass, more preferably from 15 to 70 parts by mass, further preferably from 20 to 50 parts by mass, and particularly preferably from 20 to 40 parts by mass based on 100 parts by mass of the resin solid content. When the content of the maleimide compound (E) is in the above range, the heat resistance of the obtained cured product and the curability of the resin composition tend to improve more.

(Other Resins)

Further, the thermosetting compounds such as the phenolic resin (F), the acrylic resin (G), the polyamide resin (H), the polyamideimide resin (I), and the thermosetting polyimide resin (J) are not particularly limited as long as they are generally known. In addition, these resins are preferably appropriately used in combination with any one or more components selected from the epoxy resin (C), the cyanate compound (D), and the maleimide compound (E).

[Molybdenum Compound (L)]

The resin composition in the present embodiment may further comprise a molybdenum compound (L). By comprising the molybdenum compound (L), the mechanical drillability of the obtained cured product tends to improve more. A molybdenum compound is not included in the inorganic filler of the present embodiment.

The molybdenum compound (L) is not particularly limited as long as it comprises molybdenum in the molecule. Examples thereof include molybdic acid, zinc molybdate, ammonium molybdate, sodium molybdate, calcium molybdate, potassium molybdate, molybdenum trioxide, and molybdenum disulfide. Among these, molybdic acid, zinc molybdate, ammonium molybdate, and molybdenum trioxide are preferred in terms of not serving as an organometallic catalyst.

The surface of the molybdenum compound (L) is preferably treated with an inorganic oxide. The surface treatment method is not particularly limited. Examples thereof include a method of treating the surface of a commercially available molybdenum compound with an inorganic oxide by a method such as a sol-gel method or a liquid phase deposition method. The molybdenum compound (L) whose surface is treated with an inorganic oxide is particularly preferred, because the inorganic oxide acts for heat dissipation characteristics, the molybdenum compound (L) acts for mechanical drillability, and therefore both two conflicting characteristics, mechanical drillability and heat resistance, can be achieved.

The inorganic oxide with which the molybdenum compound (L) is surface-treated is not particularly limited. Examples thereof include silica, titania, alumina, and silcoxide. Among these, silica is preferred in terms of heat dissipation characteristics and insulation characteristics.

In addition, the thickness of the surface inorganic oxide with which the molybdenum compound (L) is surface-treated is not particularly limited but is preferably 15 to 50 nm. When the thickness of the surface inorganic oxide is 15 nm or more, the heat resistance tends to improve more. In addition, when the thickness of the surface inorganic oxide is 50 nm or less, cracks that occur when the molybdenum compound (L) is treated with the inorganic oxide tend to be able to be decreased.

The molybdenum compound (L) whose surface is treated with an inorganic oxide can be prepared, for example, as follows: A molybdenum compound powder is dispersed in an alcohol solution in which a metal alkoxide such as a silicon alkoxide or an aluminum alkoxide is dissolved, and a mixed solution of water, an alcohol, and a catalyst is added by drops while stirring, to hydrolyze the alkoxide to form a film of silicon oxide, aluminum oxide, or the like on the powder surface as a film. Then, the powder is subjected to solid-liquid separation and vacuum drying, and then subjected to heat treatment as in the same way as above. By this operation, the molybdenum compound (L) having a film on the surface of a powder is obtained.

The content of the molybdenum compound (L) is preferably from 0.1 to 10 parts by mass, more preferably from 0.3 to 5 parts by mass, and further preferably from 0.5 to 3 parts by mass based on 100 parts by mass of the resin solid content. When the content of the molybdenum compound (L) is in the above range, the mechanical drillability tends to improve more.

[Other Components]

The resin composition in the present embodiment may also comprise other components in addition to the above-described components, as needed. For example, the resin composition in the present embodiment may comprise a silane coupling agent. The silanol group of a silane coupling agent particularly exhibits affinity and reactivity with a material having a hydroxyl group on the surface and therefore is effective for the improvement of an organic substance-inorganic substance bond. When the surface of the inorganic filler reacts with the silane coupling agent, the adhesiveness between the thermosetting resin and the inorganic filler is improved. In other words, the effect of improving the peel strength, the elastic modulus, the moisture absorption heat resistance, and the appearance of the cured product is expected.

The silane coupling agent used is not particularly limited as long as it is a silane coupling agent generally used for the surface treatment of inorganic substance. Specific examples thereof include aminosilane-based silane coupling agents such as γ-aminopropyltriethoxysilane and N-β-(aminoethyl)-γ-aminopropyltrimethoxysilane; epoxysilane-based silane coupling agents such as γ-glycidoxypropyltrimethoxysilane; vinylsilane-based silane coupling agents such as γ-methacryloxypropyltrimethoxysilane; cationic silane-based silane coupling agents such as N-β-(N-vinylbenzylaminoethyl)-γ-aminopropyltrimethoxysilane hydrochloride; and phenylsilane-based silane coupling agents. One silane coupling agent can be used, or two or more silane coupling agents can be used in appropriate combination.

The content of the silane coupling agent is preferably from 3 to 30 parts by mass based on 100 parts by mass of the resin solid content. When the content of the silane coupling agent is in the above range, the adhesiveness between the resin and the inorganic filler tends to be more improved without decreasing the glass transition temperature of the obtained cured product.

In addition, the resin composition in the present embodiment may comprise a wetting and dispersing agent as needed. By using the wetting and dispersing agent, the dispersibility of the inorganic filler can be more improved. These wetting and dispersing agents are not particularly limited as long as they are dispersion stabilizers used for paints. Examples thereof include Disperbyk-110, 111, 161, 180, and W903 manufactured by BYK Japan KK. One wetting and dispersing agent can be used, or two or more wetting and dispersing agents can be used in appropriate combination.

In addition, in order to appropriately adjust the curing rate, the resin composition in the present embodiment may comprise a curing accelerator. The curing accelerator is not particularly limited as long as it is generally used as a curing accelerator for the above thermosetting compound. Examples thereof include organometallic salts of copper, zinc, cobalt, nickel, manganese, and the like, imidazoles and derivatives thereof, and tertiary amines. In addition, one of the above-described curing accelerators may be used, or two or more of the above-described curing accelerators may be used in appropriate combination. The content of the curing accelerator can be appropriately adjusted from the viewpoint of the degree of cure of the resin, the viscosity of the resin composition, and the like and is usually about from 0.01 to 15 parts by mass based on 100 parts by mass of the resin solid content.

In addition, various polymer compounds such as another thermosetting compound, a thermoplastic compound, and oligomers thereof, and an elastomer, another flame-retardant compound, an additive, and the like may be added. These are not particularly limited as long as they are generally used. Examples of the flame-retardant compound include phosphorus compounds such as phosphates and melamine phosphate; nitrogen-containing compounds such as melamine and benzoguanamine; oxazine ring-containing compounds; and silicone-based compounds. Examples of the additive include ultraviolet absorbing agents, antioxidants, photopolymerization initiators, fluorescent brightening agents, photosensitizers, dyes, pigments, thickening agents, lubricants, defoaming agents, dispersing agents, leveling agents, brightening agents, and polymerization inhibitors. One additive may be used or two or more additives may be used in appropriate combination as needed.

The resin composition in the present embodiment may comprise an organic solvent as needed. The organic solvent is used in order to decrease the viscosity of the resin composition to improve handling properties and increase impregnation properties into a glass cloth. The organic solvent is not particularly limited as long as a mixture of the above thermosetting compounds is compatible with the organic solvent. Examples thereof include, but are not limited to, ketones such as acetone, methyl ethyl ketone, methyl isobutyl ketone, and cyclohexanone; aromatic hydrocarbons such as benzene, toluene, and xylene; and amides such as dimethylformamide and dimethylacetamide. In addition, these organic solvents may be used alone, or two or more of these organic solvents may be used in appropriate combination.

[Method for Preparing Resin Composition]

The method for preparing the resin composition in the present embodiment is not particularly limited as long as it is a method of combining the inorganic filler (B) containing the aluminosilicate (A) and a thermosetting compound to prepare a resin composition. Examples thereof include a method of dispersing the inorganic filler (B) containing the aluminosilicate (A) in the epoxy resin (C) by a homomixer or the like, and blending the cyanate compound (D) and the maleimide compound (E) therein. Further, it is desired to add an organic solvent in order to decrease viscosity to improve handling properties and increase impregnation properties into a glass cloth.

[Applications]

The above resin composition can be used as constituent materials of a prepreg, a metallic foil-clad laminate, a printed wiring board, and the like.

A prepreg in the present embodiment comprises a base material; and the above resin composition with which the base material is impregnated or coated. The method for producing the prepreg in the present embodiment is not particularly limited as long as it is a method of combining the above resin composition and a base material to produce a prepreg. Examples thereof include a method of impregnating or coating a base material with the above resin composition and then semi-curing the resin composition by a method of heating in a dryer at 100 to 200° C. for 1 to 60 minutes to produce a prepreg. The amount of the resin composition (including the inorganic filler) adhering to the base material is preferably 40 to 95% by mass based on the total amount of the prepreg.

For the base material used when the prepreg in the present embodiment is produced, known ones used for various printed wiring board materials can be used. Examples thereof include inorganic fibers of E glass, T glass, L glass, D glass, S glass, NE glass, quartz, and the like, and organic fibers of polyimides, polyamides, polyesters, and the like. The base material can be appropriately selected depending on the intended application and performance.

Examples of the shape of the base material include woven fabrics, nonwoven fabrics, rovings, chopped strand mats, and surfacing mats. The thickness of the base material is not particularly limited and is usually from 0.01 to 0.3 mm, and is, for example, preferably in the range of from 0.01 to 0.2 mm for laminate applications.

The above-described base material may be subjected to surface treatment from the viewpoint of adhesiveness to the resin and moisture absorption heat resistance, and, for example, the surface of the base material can be surface-treated with a silane coupling agent or the like. In addition, when a woven fabric is used as the base material, the woven fabric may be physically opened. When a film is used as the base material, the base material is preferably surface-treated by plasma treatment or the like from the viewpoint of adhesiveness to the resin.

A laminate in the present embodiment comprises the above prepreg; and metallic foil laminated on one surface or both surfaces of the prepreg. Specifically, the laminate in the present embodiment can be produced by laminate molding with a configuration in which one or a plurality of the above prepregs are stacked, and foil of a metal such as copper or aluminum is disposed on one surface or both surfaces of the stack as desired. The metallic foil used is not particularly limited as long as it is used for a printed wiring board material. As the molding conditions, conventional methods for laminates and multilayer boards for printed wiring boards can be applied. For example, a multistage press, a multistage vacuum press, a continuous molding machine, an autoclave molding machine, or the like is used, and generally, the temperature is in the range of from 100 to 300° C., the pressure is in the range of from 2 to 100 kgf/cm2, and the heating time is in the range of from 0.05 to 5 hours. In addition, a multilayer board can also be provided by combining the prepreg of the present invention and a separately prepared wiring board for an inner layer and laminate-molding the combination.

The above metallic foil-clad laminate in the present embodiment can be preferably used as a printed wiring board by forming a predetermined wiring pattern. The metallic foil-clad laminate of the present invention has a low thermal expansion rate and good moldability and chemical resistance and can be especially effectively used as a printed wiring board for a semiconductor package requiring performance.

A printed wiring board in the present embodiment comprises an insulating layer comprising the above resin composition; and a conductor layer formed on a surface of the insulating layer. The printed wiring board can be produced, for example, by the following method. First, the above metallic foil-clad laminate such as a copper-clad laminate is provided. The surfaces of the metallic foil-clad laminate are subjected to etching treatment to form inner layer circuits to make an inner layer board. The inner layer circuit surfaces of this inner layer board are subjected to surface treatment for increasing adhesive strength, as needed. Then, predetermined numbers of the prepregs of the present invention are stacked on the inner layer circuit surfaces, metallic foil for outer layer circuits is further laminated on the outside of the stack, and the laminate is heated and pressurized for integral formation. In this manner, a multilayer laminate in which insulating layers comprising a base material and a cured product of a thermosetting resin composition are formed between inner layer circuits and metallic foil for outer layer circuits is produced. Then, this multilayer laminate is subjected to perforation to make through holes or via holes, and then desmear treatment for removing smears that are resin residues derived from the resin component contained in the cured product layers is performed. Then, plating metal films that allow conduction between the inner layer circuits and the metallic foil for outer layer circuits are formed on the wall surfaces of these holes. Further, the metallic foil for outer layer circuits is subjected to etching treatment to form outer layer circuits, and a printed wiring board is produced.

The insulating layer comprising the resin composition of the present invention includes the prepreg of the present invention (a base material and the resin composition of the present invention with which the base material is impregnated) and the resin composition layer of the metallic foil-clad laminate of the present invention (a layer comprising the resin composition of the present invention)e.

EXAMPLES

The present embodiment will be specifically described below using a Synthesis Example, Examples, and Comparative Examples, but the present embodiment is not limited to these.

Synthesis Example 1

0.47 mol (in terms of OH groups) of an α-naphthol aralkyl resin (SN495V, OH group equivalent: 236 g/eq., manufactured by NIPPON STEEL & SUMIKIN CHEMICAL CO., LTD.: including those having n of from 1 to 5) was dissolved in 500 mL of chloroform, and 0.7 mol of triethylamine was added to this solution. 300 g of a chloroform solution of 0.93 mol of cyanogen chloride was dropped therein at −10° C. over 1.5 hours, and the mixture was stirred for 30 minutes. Then, a mixed solution of 0.1 mol of triethylamine and 30 g of chloroform was further dropped, and the mixture was stirred for 30 minutes to complete the reaction. The produced hydrochloride of triethylamine was filtered off. Then, the obtained filtrate was washed with 500 mL of 0.1 N hydrochloric acid, and then washing with 500 mL of water was repeated four times. This was dried with sodium sulfate followed by evaporation at 75° C. and further reduced pressure degassing at 90° C. to obtain a brown solid α-naphthol aralkyl-based cyanate compound represented by the above formula (I). The obtained cyanate compound was analyzed by the infrared absorption spectrum. The absorption of the cyanate group was confirmed around 2264 cm$^{-1}$.

Example 1

30 Parts by mass of the α-naphthol aralkyl-based cyanate compound obtained in Synthesis Example 1, 15 parts by mass of bis(3-ethyl-5-methyl-4-maleimidophenyl)methane (BMI-70, manufactured by K.I Chemical Industry Co., Ltd.), 15 parts by mass of a maleimide compound (BMI-2300, manufactured by Daiwa Kasei Co., Ltd.), 20 parts by mass of a biphenyl aralkyl-based epoxy resin (NC-3000-FH, manufactured by Nippon Kayaku Co., Ltd.), 20 parts by mass of a polyoxynaphthylene-based epoxy resin (HP6000, manufactured by DIC corporation), 20 parts by mass of a silane coupling agent (OFS6040, manufactured by Dow Corning Toray Co., Ltd.), and 5 parts by mass of a wetting and dispersing agent (BYK-W903, manufactured by BYK Japan KK) were dissolved and mixed in methyl ethyl ketone, and 420 parts by mass of an aluminosilicate having an average particle diameter of 5 μm (SILATHERM 1360-400 manufactured by Sibelco Japan Ltd. [The Mineral Engineers], a silicon atom content of 20% by mass, an aluminum atom content of 29% by mass), 1 part by mass of silica-coated zinc molybdate obtained by surface-treating zinc molybdate (manufactured by NIPPON INORGANIC COLOUR & CHEMICAL CO., LTD.) with silica, 0.01 parts by mass of NIKKA OCTHIX manganese (Mn content of 8% by mass, manufactured by The Nippon Synthetic Chemical Industry Co., Ltd.), and 0.5 parts by mass of 2,4,5-triphenylimidazole (manufactured by TOKYO CHEMICAL INDUSTRY CO., LTD.) were mixed to obtain a varnish.

The average particle diameter was determined as follows: The inorganic filler was dispersed in methyl ethyl ketone and then subjected to dispersion treatment by an ultrasonic homogenizer for 3 minutes, and measurement was performed by a laser diffraction particle size distribution measuring apparatus (manufactured by SHIMADZU CORPORATION).

In addition, the silicon atom content and the aluminum atom content were measured by an X-ray fluorescence analyzer (XRF) (manufactured by Rigaku Corporation).

This varnish was diluted with methyl ethyl ketone, and an E-glass cloth having a mass of 47.2 g/m² (manufactured by Asahi Kasei E-materials Corp.) was impregnated and coated with the diluted varnish and heated and dried at 150° C. for 3 minutes to obtain a prepreg having an inorganic filler content of 77% by mass and 54% by volume. Next, two or eight of the prepregs were stacked, and 12 μm electrolytic copper foil was disposed on the top and the bottom. The stack was pressed at a pressure of 30 kgf/cm² and a temperature of 220° C. for 120 minutes to obtain copper foil-clad laminates having thicknesses of 0.2 mm and 0.8 mm, respectively.

Using the obtained copper foil-clad laminates, the thermal conductivity, glass transition temperature, dielectric loss tangent, and mechanical drillability were evaluated. The results are shown in Table 1.
(Evaluation Methods)
[Thermal Conductivity]

The density of the copper foil-clad laminate having a thickness of 0.8 mm was measured, and the specific heat was measured by a DSC (TA Instrumen model Q100), and further the thermal diffusivity was measured by a xenon flash analyzer (Bruker: LFA447 Nanoflash). Then, the thermal conductivity was calculated from the following formula:

thermal conductivity (W/m·K)=density (kg/m³)×specific heat (kJ/kg·K)×thermal diffusivity (m²/S)×1000

[Glass Transition Temperature (Tg)]

Using the copper foil-clad laminate having a thickness of 0.8 mm as a test piece, the glass transition temperature was measured according to JIS C6481 using a dynamic viscoelasticity analyzer (manufactured by TA Instruments).
[Dielectric Loss Tangent (Df)]

Using a test piece obtained by removing the copper foil of the copper foil-clad laminate having a thickness of 0.8 mm, the measurement of the dielectric loss tangent at 1 GHz was carried out three times by a cavity resonator perturbation method (Agilent 8722ES, manufactured by Agilent Technologies), and the average value was calculated.
[Mechanical Drillability]

Using the copper foil-clad laminate having a thickness of 0.2 mm, the mechanical drillability was evaluated under the following hole processing (Numerical Control (NC) drilling) conditions:

Processing machine; Hitachi Via Mechanics, Ltd. ND-1 V212

Number of stackings; a stack of three sets of two-ply copper-clad laminates

Entry sheet; LE900 manufactured by MITSUBISHI GAS CHEMICAL COMPANY, INC.

Backup board; SPB-W manufactured by NIHON DECOLUXE CO., LTD.

Drill bit; KMC L518A 0.105×1.8, manufactured by UNION TOOL CO.

After 3000 hole processing, the number of holes was measured by a hole analyzer (manufactured by Hitachi Via Mechanics, Ltd.) for the back surface of the lowermost plate of the stacked copper foil-clad laminates. A case where 3000 holes could be made without the breakage of the drill bit for two processings was evaluated as (○), and a case where 3000 holes could not be made due to the wear or breakage of the drill bit during the processing was evaluated as (×).

Example 2

Operation was performed in the same way as in Example 1 except that 337.5 parts by mass of an aluminosilicate (SILATHERM 1360-400) and 112.5 parts by mass of alumina having an average particle diameter of 0.3 μm (ASFP-20, manufactured by DENKI KAGAKU KOGYO KABUSHIKI KAISHA) were used to obtain a prepreg having an inorganic filler content of 78% by mass and 55% by volume. Copper foil-clad laminates having thicknesses of 0.2 mm and 0.8 mm were obtained. The property measurement results of the obtained copper foil-clad laminates are shown in Table 1.

Comparative Example 1

Operation was performed in the same way as in Example 1 except that 300 parts by mass of boehmite having an average particle diameter of 2.8 μm (MM011, manufactured by KAWAI LIME INDUSTRY CO., LTD.) and 100 parts by mass of alumina having an average particle diameter of 0.3 μm (ASFP-20) were used instead of the aluminosilicate (SILATHERM 1360-400) in Example 1 to obtain a prepreg having an inorganic filler content of 76% by mass and 56% by volume. Copper foil-clad laminates having thicknesses of 0.2 mm and 0.8 mm were obtained. The property measurement results of the obtained copper foil-clad laminates are shown in Table 1.

Comparative Example 2

Operation was performed in the same way as in Example 1 except that 460 parts by mass of alumina having an average particle diameter of 3.4 μm (AA-3, manufactured by Sumitomo Chemical Co., Ltd.) was used instead of the aluminosilicate (SILATHERM 1360-400) in Example 1 to obtain a prepreg having an inorganic filler content of 78% by mass and 54% by volume. Copper foil-clad laminates having thicknesses of 0.2 mm and 0.8 mm were obtained. The property measurement results of the obtained copper foil-clad laminates are shown in Table 1.

Comparative Example 3

Operation was performed in the same way as in Example 1 except that 380 parts by mass of alumina having an average particle diameter of 3.4 μm (AA-3, manufactured by Sumitomo Chemical Co., Ltd.) and 100 parts by mass of the alumina having an average particle diameter of 0.3 μm (ASFP-20) used in Comparative Example 1 were used instead of the aluminosilicate (SILATHERM 1360-400) in Example 1 to obtain a prepreg having an inorganic filler content of 79% by mass and 55% by volume. Copper foil-clad laminates having thicknesses of 0.2 mm and 0.8 mm were obtained. The property measurement results of the obtained copper foil-clad laminates are shown in Table 1.

Comparative Example 4

Operation was performed in the same way as in Example 1 except that 300 parts by mass of silica having an average particle diameter of 3.4 μm (FB-3SDC, manufactured by DENKI KAGAKU KOGYO KABUSHIKI KAISHA) was used instead of the aluminosilicate (SILATHERM 1360-400) in Example 1 to obtain a prepreg having an inorganic filler content of 74% by mass and 58% by volume. Copper foil-clad laminates having thicknesses of 0.2 mm and 0.8 mm were obtained. The property measurement results of the obtained copper foil-clad laminates are shown in Table 1.

TABLE 1

|  | Example 1 | Example 2 | Comparative Example 1 | Comparative Example 2 | Comparative Example 3 | Comparative Example 4 |
|---|---|---|---|---|---|---|
| Thermal conductivity (W/m · k) | 2.0 | 2.0 | 2.0 | 1.9 | 2.0 | 0.6 |
| Glass transition temperature (° C.) | 286 | 287 | 285 | 288 | 288 | 285 |
| Dielectric loss tangent/1 GHz | 0.007 | 0.007 | 0.017 | 0.007 | 0.007 | 0.006 |
| NC drilling (whether 3000 hole processing is possible or not) | ○ | ○ | ○ | x | x | ○ |

This application is based on Japanese Patent Application No. 2014-147700 filed with the Japan Patent Office on Jul. 18, 2014, the contents of which are incorporated herein by reference.

INDUSTRIAL APPLICABILITY

The present invention has industrial applicability as a resin composition used in forming an insulating layer for a printed wiring board, a prepreg and a metallic foil-clad laminate.

The invention claimed is:

1. A resin composition comprising:
   an inorganic filler (B) comprising an aluminosilicate (A) having a silicon atom content of from 14 to 21% by mass, an aluminum atom content of from 23 to 43% by mass, and an average particle diameter (D50) of from 0.5 to 10 μm; and
   one or more thermosetting compounds selected from the group consisting of a cyanate compound (D), a maleimide compound (E), an acrylic resin (G), a polyamide resin (H), a polyamideimide resin (I), and a thermosetting polyimide resin (J),
   wherein a content of the inorganic filler (B) is from 250 to 800 parts by mass based on 100 parts by mass of resin solid content.

2. The resin composition according to claim 1, wherein the inorganic filler (B) contains a second inorganic filler (K) having an average particle: diameter (D50) of from 0.1 to 0.4 μm.

3. The resin composition according to claim 2, wherein the second inorganic filler (K) is one or more selected from the group consisting of an aluminosilicate having a silicon atom content of from 9 to 23% by mass and an aluminum atom content of from 21 to 43% by mass, alumina, magnesium oxide, boron nitride, and aluminum nitride.

4. The resin composition according to claim 1, wherein the cyanate compound (D) is one or more selected from the group consisting of a naphthol aralkyl-based cyanate compound represented by general formula (1), a novolac-based cyanate compound represented by general formula (2), and a biphenyl aralkyl-based cyanate compound represented by general formula (3),

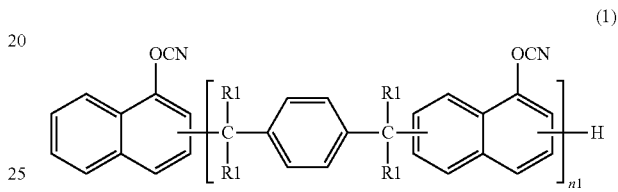

wherein R1 each independently represents a hydrogen atom or a methyl group, and n1 represents an integer of from 1 to 50,

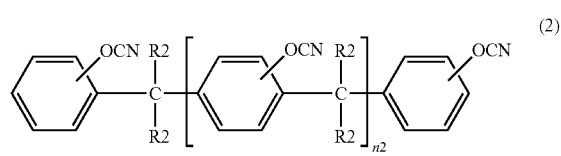

wherein R2 each independently represents a hydrogen atom or a methyl group, and n2 represents an integer of from 1 to 50 or more,

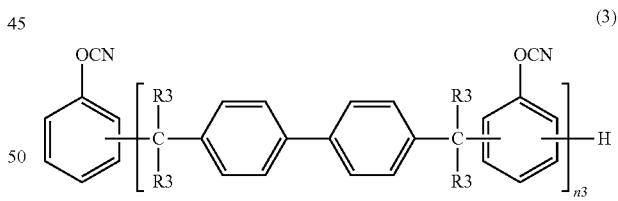

wherein R3 each independently represents a hydrogen atom or a methyl group, and n3 represents an integer of from 1 to 50.

5. The resin composition according to claim 1, wherein the maleimide compound (E) is one or more selected from the group consisting of bis(4-maleimidophenyl)methane, 2,2-bis{4-(4-maleimidophenoxy)-phenyl}propane, and bis(3-ethyl-5-methyl-4-maleimidophenyl)methane.

6. The resin composition according to claim 1, further comprising a molybdenum compound (L).

7. The resin composition according to claim 6, wherein a content of the molybdenum compound (L) is from 0.1 to 10 parts by mass based on 100 parts by mass of the resin solid content.

8. The resin composition according to claim 6, wherein a surface of the molybdenum compound (L) is treated with an inorganic oxide.

9. A prepreg comprising:
a base material; and
the resin composition according to claim 1 with which the base material is impregnated or coated.

10. A metallic foil-clad laminate comprising:
the prepreg according to claim 9; and
a metallic foil laminated on one or both surfaces of the prepreg.

11. A printed wiring board comprising:
an insulating layer comprising the resin composition according to claim 1; and
a conductor layer formed on a surface of the insulating layer.

* * * * *